United States Patent
Mayer et al.

(10) Patent No.: US 7,573,347 B2
(45) Date of Patent: Aug. 11, 2009

(54) DIGITALLY CONTROLLED OSCILLATOR DEVICE AND METHOD FOR GENERATING AN OSCILLATING SIGNAL WITH A DIGITALLY CONTROLLED PHASE LOCKED LOOP

(75) Inventors: Thomas Mayer, Linz (AT); Yangjian Chen, Linz (AT); Tindaro Pittorino, Linz (AT); Linus Maurer, Linz (AT); Volker Neubauer, Linz (AT)

(73) Assignee: Infineon Technologies AG, Munich (DE)

( * ) Notice: Subject to any disclaimer, the term of this patent is extended or adjusted under 35 U.S.C. 154(b) by 98 days.

(21) Appl. No.: 11/401,393

(22) Filed: Apr. 10, 2006

(65) Prior Publication Data

US 2007/0222526 A1    Sep. 27, 2007

(30) Foreign Application Priority Data

Mar. 10, 2006    (DE) .................. 10 2006 011 285

(51) Int. Cl.
*H03B 5/12*    (2006.01)
(52) U.S. Cl. .................. 331/179; 331/36 C; 331/177 V; 331/167; 331/182
(58) Field of Classification Search ............... 331/36 C, 331/108 R, 117 R, 177 FE, 108 C, 167, 177 R, 331/177 V, 182, 183, 185, 186, 117 FE, 179
See application file for complete search history.

(56) References Cited

U.S. PATENT DOCUMENTS

| | | | | |
|---|---|---|---|---|
| 4,862,485 A | * | 8/1989 | Guinea et al. | 375/376 |
| 6,658,748 B1 | * | 12/2003 | Leipold et al. | 331/179 |
| 6,791,425 B2 | * | 9/2004 | Kitamura | 331/117 R |

(Continued)

FOREIGN PATENT DOCUMENTS

DE    103 08 921 A1    9/2004

(Continued)

OTHER PUBLICATIONS

"All-Digital TX Frequency Synthesizer and Discrete-Time Receiver for Bluetooth Radio in 130-nm CMOS", Robert Bodgan Staszewski, Khurram Muhammad, Dirk Leipold, Chih-Ming Hung, Yo-Chuol Ho, John L. Wallberg, Chan Fernando, Ken Maggio, Roman Staszewski, Tom Jung, Jinseok Koh, Soji John, Irene Yuanying Deng, Vivek Sarda, Oscar Moreira-Tamayo, Alerian Mayega, Ran Katz, Ofer Friedman, Oren Eytan Eliezer, Elida De-Obaldia and Poras T. Balsara, IEEE Journal of Solid-State Circuits, vol. 39, No. 12, Dec. 2004, pp. 2278-2291.

*Primary Examiner*—Robert Pascal
*Assistant Examiner*—Ryan J. Johnson
(74) *Attorney, Agent, or Firm*—Eschweiler & Associates, LLC (57) ABSTRACT

A digitally controlled oscillator device includes a programming input, a selection input and an oscillator core with a first capacitive element which is frequency determining and programmable. The first capacitive element is coupled to the programming input that receives a first data word by which an oscillating frequency of the oscillator device is programmed with a predetermined frequency step size. The oscillator device further includes a selection unit for selecting a mode which is coupled to the selection input that receives a mode selection signal. The mode is selectable from a plurality of modes depending on the mode selection signal and each mode from the plurality of modes is characterized by a predetermined frequency step size. The digitally controlled oscillator device also includes a deattenuation amplifier.

32 Claims, 6 Drawing Sheets

U.S. PATENT DOCUMENTS

| | | | |
|---|---|---|---|
| 6,838,951 B1 * | 1/2005 | Nieri et al. | 331/177 V |
| 7,053,719 B2 * | 5/2006 | Steinbach et al. | 331/16 |
| 7,212,073 B2 * | 5/2007 | Youssoufian et al. | 331/36 C |
| 7,336,134 B1 * | 2/2008 | Janesch et al. | 331/36 C |
| 2003/0107442 A1 * | 6/2003 | Staszewski | 331/1 A |
| 2003/0141936 A1 | 7/2003 | Staszewski et al. | |
| 2006/0020758 A1 * | 1/2006 | Wheeler et al. | 711/137 |
| 2006/0226916 A1 * | 10/2006 | Florescu et al. | 331/16 |

FOREIGN PATENT DOCUMENTS

| | | |
|---|---|---|
| DE | 103 39 703 A1 | 4/2005 |

* cited by examiner

DIGITALLY CONTROLLED OSCILLATOR DEVICE AND METHOD FOR GENERATING AN OSCILLATING SIGNAL WITH A DIGITALLY CONTROLLED PHASE LOCKED LOOP

REFERENCE TO RELATED APPLICATIONS

This application claims the benefit of the priority date of German application DE 10 2006 011 285.7, filed on Mar. 10, 2006, the contents of which are herein incorporated by reference in their entirety.

FIELD OF THE INVENTION

The invention relates to a digitally controlled oscillator device and to a method for generating an oscillating signal. The invention relates also to a digitally controlled phase locked loop with the oscillator device and a method of using the digitally controlled oscillator device.

BACKGROUND OF THE INVENTION

In order to achieve global mobility and a wide range access to offered mobile services for today's wireless radio systems and the users of these wireless radio systems, it is desirable to provide dual mode wireless radio systems. These systems are capable of operating with different wireless radio system standards, as for example, global system for mobile communication, GSM, enhanced data rates for GSM evolution, EDGE, universal mobile telecommunication standard, UMTS, or others. For generating, transmitting or receiving of radio frequency signals, nowadays digitally controlled oscillators, DCOs, are used. A DCO generates a radio frequency signal depending on a digital frequency word. Realized in a semiconductor device, a digitally controlled phase locked loop, PLL, with a DCO uses less space than a respective PLL with an analog voltage controlled oscillator, VCO.

In different standards, the wireless systems have different requirements on DCO performance. For a DCO specified for GSM the smallest frequency step size, that means the spacing between two tunable frequencies, should not be greater than 10 kHz, if no oversampling is used for controlling the DCO. The required frequency step size increases to about 100 kHz in case oversampling is used. In addition, the requirements for phase noise performance are stringent for GSM.

In contrast, for UMTS, the smallest possible frequency step size should be smaller than 200 kHz without oversampling, respectively, smaller than 500 kHz with oversampling. The requirements for phase noise performance for UMTS are moderate compared to GSM/EDGE.

To use a DCO in a direct phase modulator, it is practical to consider a required frequency step size in the DCO and a wanted modulation bandwidth. A fine resolution of the frequency step should be required to get an acceptable value for the error vector magnitude, EVM, of the output signal of the DCO. The modulation bandwidth is defined by the maximum frequency range required to achieve a modulation standard having the same number of available frequency steps. A smaller frequency step size results in a smaller achievable modulation bandwidth.

Wireless radio systems like GSM/EDGE have a limited modulation bandwidth of the output signal but high requirements for the error vector magnitude. UMTS systems have a broader modulation bandwidth but not the same restrictive requirements on the error vector magnitude.

DCOs known today are only adapted for a single standard. When integrating several wireless radio system standards into one device, the radio frequency blocks in the device should be shared as much as possible between different standards. This is especially desirable with shrinking structures of semiconductor technologies.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

In one embodiment, a digitally controlled oscillator device comprises a programming input, a selection input, an oscillator core and a deattenuation amplifier. The oscillator core comprises a first capacitive element which is frequency determining and programmable. The first capacitive element is coupled to the programming input and receives a first data word thereat for programming an oscillating frequency of the oscillator device with a predetermined frequency step size. The oscillator device further comprises a selection unit which is coupled to the selection input for providing a mode selection signal. Hereby, a mode is selectable from a plurality of modes depending on the mode selection signal. Furthermore, each mode of the plurality of modes is characterized by a predetermined frequency step size. So, a radio frequency signal for different requirements, for example of different wireless radio system standards, can be generated.

The oscillator device can be used in a mobile radio device for different wireless radio system standards.

In another embodiment of the invention, a digitally controlled phase locked loop an oscillator device comprises an oscillator output for providing an oscillating signal with an oscillation frequency. The digitally controlled phase locked loop further comprises a signal output which is coupled to the oscillator output, and a digital phase detector. The digital phase detector comprises a first input for receiving a reference frequency signal, and a second input coupled to the signal output. The digitally controlled phase locked loop also comprises a digital loop filter which on the input side is coupled to an output of the phase detector and on the output side is coupled to the programming input of the oscillator device. Therefore the digitally controlled phase locked loop for different requirements regarding a frequency step size can be used, for example, to accommodate different wireless radio system standards.

In a method for generating an oscillating signal a mode is selected from a plurality of modes with which a frequency step size for programming an oscillating frequency of the oscillating signal can be predetermined. Depending on the selected mode, the frequency step size is predetermined. The oscillating frequency is programmed with the predetermined frequency step size depending on a data word and the selected mode. So this method can be used for generating radio frequency signals flexibly for different requirements.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

The text below explains the invention in detail using exemplary embodiments with reference to the drawings, in which.

DETAILED DESCRIPTION OF THE INVENTION

According to one embodiment of the invention, the oscillating frequency of an oscillating signal can be programmed in the oscillator core by providing a data word. The data word is characterized, in one example, by the same bit-width, meaning the same number of bits for the modes which are selectable. A frequency resolution for the oscillating frequency, programmable by the first data word, is determined by the predetermined frequency step size. One predetermined frequency step size can be selected using the selection unit. So, a radio frequency signal for different requirements, for example, different wireless radio system standards, can be generated. The radio frequency signal in each case is adapted to the requirements. For example, a wireless radio system standard relates to a mode of the oscillator device.

Figure 1:
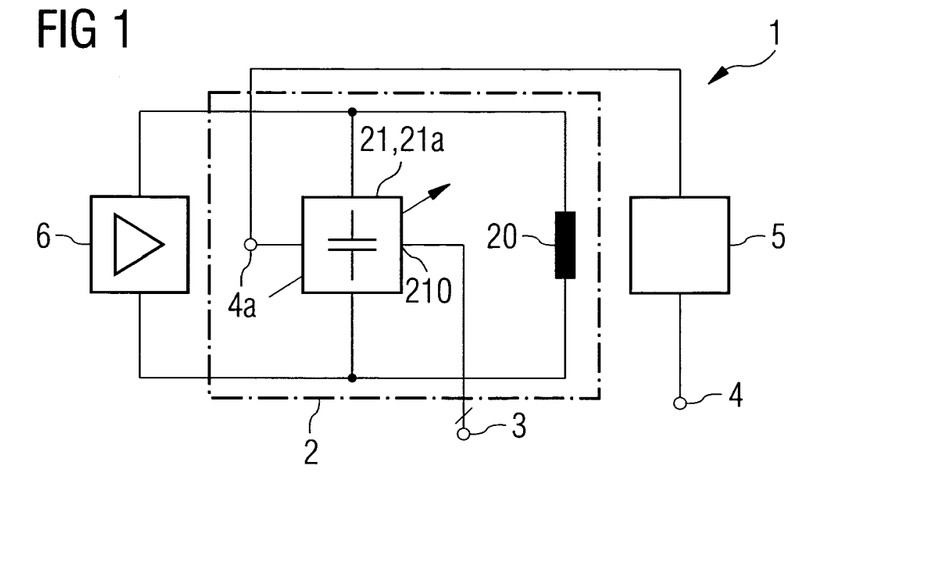
FIG. 1 is a combined block/schematic diagram illustrating an exemplary embodiment of the oscillator device according to the invention.

FIG. 1 shows a first exemplary embodiment of the oscillator device 1 according to the invention. The oscillator device 1 comprises an oscillator core 2 which features a first capacitive element 21 and an inductive element 20. A deattenuation amplifier 6 is connected to the oscillator core 2. A selection unit 5 connected to a selection input 4 is coupled to an input 4a of the first capacitive element 21 for determining a frequency step size. The first capacitive element 21 is furthermore connected with an input 210 to a programming input 3 for providing a data word. Using said data word, an oscillating frequency of an oscillating signal generated by the oscillator core can be programmed.

Since resonant circuits have damping, it is necessary to provide an appropriate source of energy or a damping reduction amplifier which compensates for the damping in the form of an impedance. In the oscillator device shown in FIG. 1, a negative impedance is indicated by a deattenuation amplifier 6.

Selecting a mode can be done using the selection input 4. The selectable modes particularly differ by the frequency step size used for programming an oscillating frequency in the oscillator core. The oscillating frequency depends on the capacitance of the first capacitive element 21 and the inductance of the inductive element 20 according to equation $$f = \frac{1}{2\pi\sqrt{LC}}, \quad (1)$$

where f is the value of the oscillating frequency, C is the capacitance of the first capacitive element 21, and L is the inductance of the inductive element 20. Having an inductive element 20 with a constant inductance, the oscillating frequency f is programmable by the capacitance C of the first capacitive element 21. The programming is done in predetermined steps because a digital data word is provided. Accordingly, the oscillating frequency changes with a predetermined frequency step size. The frequency step size for varying the capacitance of the first capacitive element 21 can be determined or adjusted via the selection unit 5, however.

So it is possible to provide different modes for a digitally controlled oscillator, where the modes result from different requirements on a frequency resolution from wireless radio system standards, for example.

In one embodiment of the invention, the oscillator core comprises a second capacitive element which is frequency determining. Thereby the second capacitive element can also be programmable and is coupled to the programming input for receiving the second data word in this example. Accordingly, the oscillating frequency of the oscillator device can be adjusted.

The first capacitive element can provide a fine-tuning of the oscillating frequency with the predetermined frequency step size while the second capacitive element provides a coarse tuning of the oscillating frequency. The frequency step size for the coarse tuning is greater than the predetermined frequency step size for the fine-tuning.

For example, by adjusting the frequency with the second capacitive element, a frequency band can be selected in which a radio frequency signal is to be generated, eventually in a mobile radio device. A fine-tuning of the frequency within this frequency band is done by programming the first capacitive element. In this way it can be achieved that the whole frequency bandwidth, which is defined by a wireless radio system standard, is not required to be tuned with fine frequency steps.

In one embodiment, the first and/or the second capacitive element can comprise a plurality of switchable capacitor devices. In such an example, an effective capacitance of a capacitive element results from the capacitances of the capacitor devices switched on. The oscillating frequency of the oscillator device is influenced by this effective capacitance. Switching on or off of a capacitor device is normally done depending on a data word. For example, the capacitances of the switchable capacitor devices of the first and/or the second capacitive elements can provide a binary weighting. That means that the capacitances of capacitor devices controlled by neighboring bits of a data word differ by a factor of 2.

If the second capacitive element is used for a coarse tuning and the first capacitive element is used for a fine tuning of the oscillating frequency, the number of switchable capacitor devices to be implemented may be decreased.

In one embodiment the switchable capacitor devices of the first and/or the second capacitive elements can comprise a plurality of switchable varactors. Varactors can be characterized by varactor diodes, MOS varactors, specially connected field effect transistors or other embodiments. The capacitance of a varactor is determined or controlled, for example, by providing a control voltage to the varactor.

Figure 2:
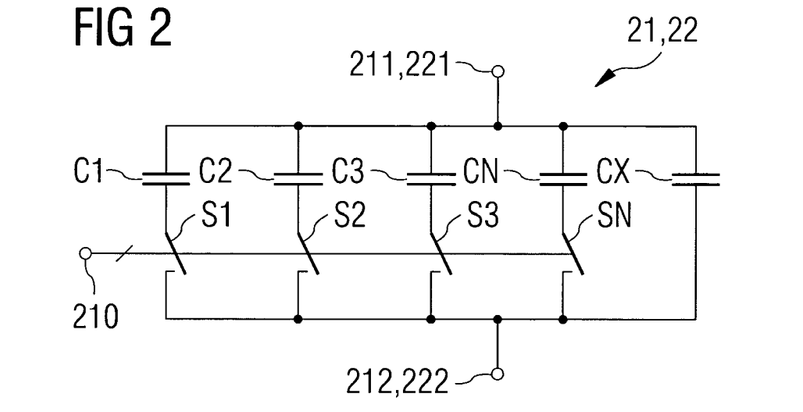
FIG. 2 is a schematic diagram illustrating an exemplary embodiment of a switchable capacitive element.

FIG. 2 shows a first exemplary embodiment of a switchable capacitive element 21, 22. The first capacitive element 21, 22 features connectors 211, 221 and 212, 222. Capacitor devices C1, C2, C3, and CN are placed between the connectors 211, 221 and 212, 222. The capacitor devices C1, C2, C3, and CN can be switched on or off via switches S1, S2, S3 and SN depending on a data word provided on the programming input 210. The capacitive element 21, 22 further comprises a capacitor device CX which is connected in parallel to the other capacitor devices C1 to CN. Although the example illustrated in FIG. 2 provides four capacitor devices, it should be understood that any number of devices may be employed and such variations are contemplated as falling within the scope of the present invention.

By providing an n-bit data word, the capacitor devices C1 to CN can be switched on or off selectively. The capacitance of the capacitive element 21, 22 in this parallel connection results from the sum of the capacitances of the single capacitor devices C1 to CN and CX. The capacitance of the used capacitor devices can be equal or provide a binary weighting. Providing a binary weighting, the capacitances of two neighboring capacitor devices differ by a factor of 2. The capacitor device CX which is in a fixed connection in this example can be omitted in the capacitive element 21, 22.

Figure 3:
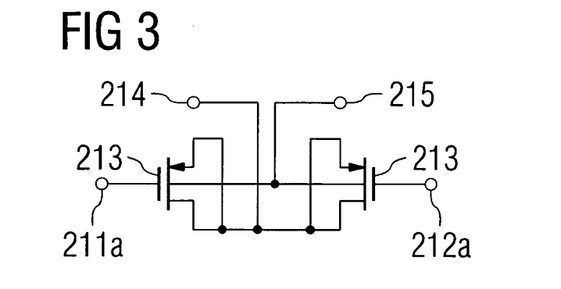
FIG. 3 is a schematic diagram illustrating an exemplary embodiment of a switchable P-MOS varactor pair.

FIG. 3 shows an exemplary embodiment of a capacitor device which is built as a P metal oxide semiconductor varactor pair, P-MOS varactor pair. The example capacitor device comprises two P-MOS transistors 213 which are coupled to the connectors 211 and 212, not shown here, of the first capacitive element via their gate connectors 211a and 212a. A supply voltage can be provided via a connector 215 which is connected to the bulk connectors of the transistors 213. The P-MOS varactor pair further features a connector 214 which is coupled to the source and the drain connector of the transistors 213, respectively.

Adjusting a capacitance of the P-MOS varactor pair is done by providing a control voltage to the connector 214. Using a P-MOS varactor pair in a digitally controlled oscillator device, the control voltage normally is switched between two fixed voltages depending on a desired capacitance of the P-MOS varactor pair.

Figure 4:
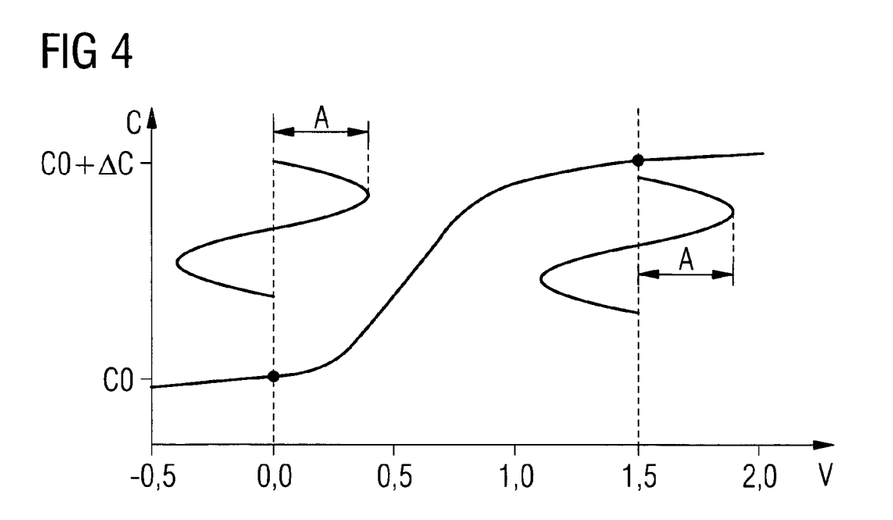
FIG. 4 is a graph illustrating an exemplary dependency of capacitance and voltage for a P-MOS varactor.

In FIG. 4, a diagram is presented which shows the dependency of the capacitance of a P-MOS varactor on the provided control voltage. For example, the capacitance for a control voltage of 0 V equals C0 and for a control voltage of 1.5 V equals the sum of C0+ΔC. By connecting in parallel a plurality of P-MOS varactors or P-MOS varactor pairs, respectively, the capacitance of a capacitive element, for example the first capacitive element 21, can be adjusted in steps of ΔC. The resulting oscillating frequency of the oscillator device is determined by equation (1). The oscillation of the oscillating signal with its amplitude A is effective on a P-MOS varactor and changes the influence of the control voltage. The varactor has a different capacitance for each instant of the oscillation. The effective capacitance of the P-MOS varactor results from a time averaged mean or the integral, respectively, of the capacitances over one oscillation period. Because the varactor is controlled symmetrically, the effective capacitance Ce of a P-MOS varactor pair results as follows:

$$Ce = \frac{2}{T} \int_0^{\frac{T}{2}} \frac{C(VCM - A\sin(\omega t))C(VCM + A\sin(\omega t))}{C(VCM + A\sin(\omega t))C(VCM - A\sin(\omega t))} dt. \quad (2)$$

In equation (2), T is the oscillating period of the oscillating signal, C(V) is the capacitance of one P-MOS varactor depending on the voltage between gate and drain or source, respectively. VCM is the control voltage provided to the varactor pair, and A sin (ωT) is the output voltage of the oscillator device becoming effective at one of the outputs 211a or 212a. By changing the oscillating amplitude, the difference of capacitance between switched on and off state of the P-MOS varactor pair can be varied. This will be discussed later on in more detail. The dependency of capacitance and oscillating amplitude especially can be seen by using equation (2) with the diagram shown in FIG. 4.

In another embodiment of the invention, the oscillator device comprises a current source which is coupled to the selection unit. The current source is equipped to control the value of a current depending on the selected mode. Said current is provided to the oscillator core. Therefore, an oscillating amplitude of the oscillator device is adjusted.

The control voltage which is provided to the switched varactor or capacitor devices varies with the oscillating amplitude of the oscillating signal. Therefore, also the instantaneous capacitance of the capacitor devices varies. Hereby, the oscillating amplitude depends on the current which is provided to the oscillator core by a current source. An effective capacitance results from the time average mean of the instantaneous capacitances which oscillate with the oscillating amplitude. Because the capacitance of a capacitor device, especially a varactor, depends on the provided control voltage, the effective capacitance can be influenced via the oscillating amplitude.

For example in a P-MOS varactor, the effective capacitance in an off state is increased with increased oscillating amplitude. While in an on state, the effective capacitance is decreased with increasing oscillating amplitude. The difference of capacitance between on and off state of the varactor changes with a varied oscillating amplitude. Because the frequency step size depends on the difference of capacitance of a capacitor device, the frequency step size is influenced by the oscillating amplitude. A higher current from the current source can result in a higher oscillating amplitude and therefore in a smaller frequency step size.

Figure 5:
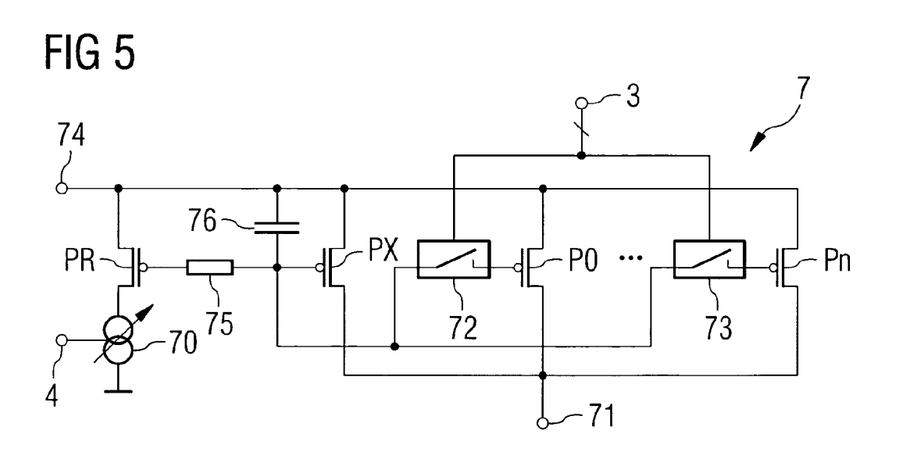
FIG. 5 is a schematic diagram illustrating an exemplary embodiment for a current source according to the invention.

FIG. 5 shows an exemplary embodiment of a current source 7 according to the invention with a current mirror with programmable mirroring ratio. The current source 7 comprises a supply voltage connector 74 to which a current source with P-channel field effect transistors PR, PX and P0 to PN is connected. As a reference current source a switchable current source 70 is provided which can be controlled by a signal on selection input 4. A current through the current source 70 is mirrored via transistor PR, resistor 75 and capacitor device 76 to the transistors PX, P0 to PN. The sum of the mirrored currents is delivered on output 71. Transistors P0 to PN are switched on or off via switches 72 and 73 depending on a data word provided on the programming input 3.

By programming the mirroring ratio with a data word on programming input 3, a fine tuning of the current can be achieved which is provided to the oscillator core 2 via the output 71. The value of a reference current generated by the switchable current source 70 can be switched between fixed values by providing a mode selection signal on selection input 4. By this, a general control of the current range can be achieved as a basis for the current provided to the oscillator core 2.

The oscillating amplitude of the oscillating signal in the oscillator device is influenced by the value of the current. As shown within the explanation for FIG. 4, the step size for a change of capacitance in the first capacitive element 21 is adjusted by the oscillating amplitude. Accordingly, also the frequency step size for programming the oscillating frequency of the oscillating signal is determined.

Instead of the current source also a voltage controller could be used which controls the voltage of the oscillating circuit depending on the mode selection signal on selection input 4. Also in this way the oscillating amplitude of the oscillating signal in the oscillating circuit and herewith the frequency step size is influenced.

In a further embodiment of the invention, a parallel capacitor can be connected or disconnected in parallel to the first capacitive elements, depending on the selected mode. Doing so, the influence that changing the capacitance of the first capacitive element has on the frequency step size is changed. If the parallel capacitor is connected in parallel to the first capacitive element, relative changes of the capacitance from the parallel connection are smaller than the relative changes for the first capacitive element without the parallel connection when programming the first capacitive element. The size of the relative changes has influence on the frequency step size in the oscillator device. Therefore, the frequency step size can be influenced by connecting or disconnecting the parallel capacitor depending on the selected mode.

In the oscillator device, also a series capacitor can be connected or disconnected in series to the first capacitive element depending on the selected mode. Connecting or disconnecting of the series capacitor results in a different effective capacitance which has influence on the oscillating frequency. So, the relative change of capacitance and, as a result from this, the frequency step size can be determined by selecting a mode. It is also possible that different series capacitors are connected in series to the first capacitive element for different modes. It is also possible to combine the connecting in series of a series capacitor and a connecting in parallel of a parallel capacitor to the first capacitive element.

Figure 6:
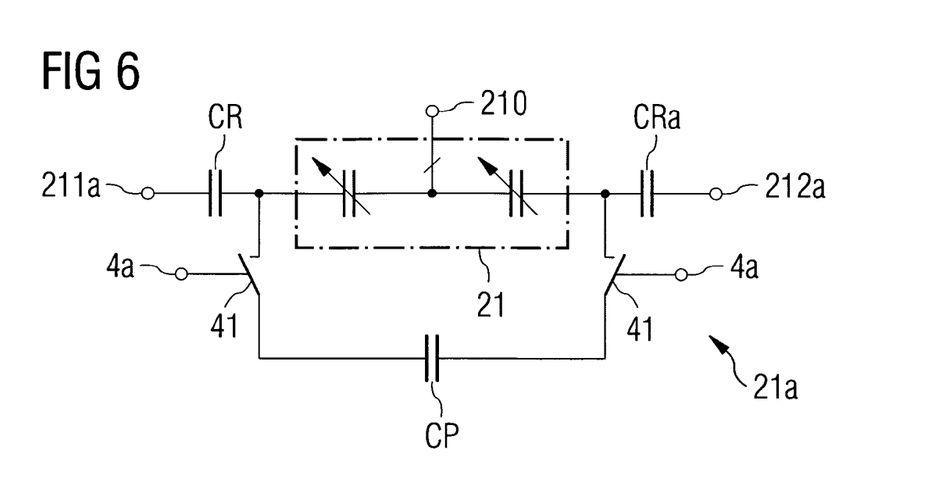
FIG. 6 is a schematic diagram illustrating a first exemplary embodiment of a switchable capacitive element according to the invention.

FIG. 6 shows a first exemplary embodiment of a switchable capacitive element according to the invention for changing the influence of a change of capacitance of a capacitive element 21 on the oscillating frequency and thereby the frequency step size. Arrangement 21a shown in FIG. 6 is connected within the oscillator core with its connectors 211a and 212a having an effective capacitance between these connectors. The arrangement 21a comprises the first capacitive element 21 whose capacitance is programmable via its input 210 which is connected to the programming input 3. Capacitor devices CR, CRa are connected in series to the first capacitive element 21. The parallel capacitor CP can be connected in parallel to the first capacitive element 21 depending on a mode selection signal provided on selection input 4a.

The arrangement 21a is arranged symmetrically. The first capacitive element 21, for example, features a plurality of P-MOS varactor pairs. If the first capacitive element 21 comprises capacitor devices which are controlled by a control voltage, the series capacitors CR, CRa can also be used as coupling capacitors for DC separation of the control voltage and the oscillating signal.

The influence of the parallel capacitor on the frequency step size will be described in the following. Connecting in parallel of the arrangement 21a to a second capacitive element 22 and an inductive element 20, for example, shown in FIG. 8, the oscillating frequency $f_{DCO}$ of the oscillator device results, the parallel capacitor CP switched off, to $$f_{DCO} = \frac{1}{2\pi\sqrt{L\left(C_2 + \frac{1}{2}\left(\frac{C_r \cdot C_1}{C_r + C_1}\right)\right)}}. \quad (3)$$

In equation (3), L is the inductance of the inductive element 20, $C_2$ is the capacitance of the second capacitive element 22, $C_r$ is the capacitance of the series capacitors CR, CRa, and $C_1$ is the programmed capacitance of the first capacitive element 21. If the value of $C_r$ is large compared to the value of $C_1$, its influence can be neglected. Accordingly, the equation for the oscillating frequency $f_{DCO}$ can be written as $$f_{DCO} = \frac{1}{2\pi\sqrt{L\left(C_2 + \frac{1}{2}C_1\right)}}. \quad (4)$$

If the parallel capacitor CP is switched on, that means, is connected in parallel, via a mode selection signal on input 4, the oscillating frequency $f_{DCO}$ is equal to $$f_{DCO} = \frac{1}{2\pi\sqrt{L\left(C_2 + \frac{1}{2}C_1'\right)}}, \quad (5)$$

with $$C_1' = \frac{(C_1 + 2 \cdot C_p) \cdot C_r}{C_1 + 2 \cdot C_p + C_r} = \frac{C_1 \cdot C_r}{C_1 + 2 \cdot C_p + C_r} + \frac{2 \cdot C_p \cdot C_r}{C_1 + 2 \cdot C_p + C_r}, \quad (6)$$

where $C_p$ is the capacitance of the parallel capacitor CP.

If $C_1$ is small compared to $2 \cdot C_p + C_r$, the influence of $C_1$ in the denominator of the equation (6) can be neglected. This results in $$C_1' = \frac{(C_1 + 2 \cdot C_p) \cdot C_r}{2 \cdot C_p + C_r} = \frac{C_1 \cdot C_r}{2 \cdot C_p + C_r} + \frac{2 \cdot C_p \cdot C_r}{2 \cdot C_p + C_r}. \quad (7)$$

As a consequence, the second term of equation (7) is a fixed capacitance while the first term can be written as $n \cdot C_1$ with $$n = \frac{C_r}{2 \cdot C_p + C_r}. \quad (8)$$

As a conclusion, the oscillating frequency of the oscillating circuit is now related with the variable programmable capacitance of the first capacitive element 21 through a square law and the constant n which is always smaller than 1. By setting $C_r$ and $C_p$ properly, it is possible to achieve one frequency step size with the switch controlled by the mode selection signal being open and a much smaller one with the switch being closed.

Figure 7:
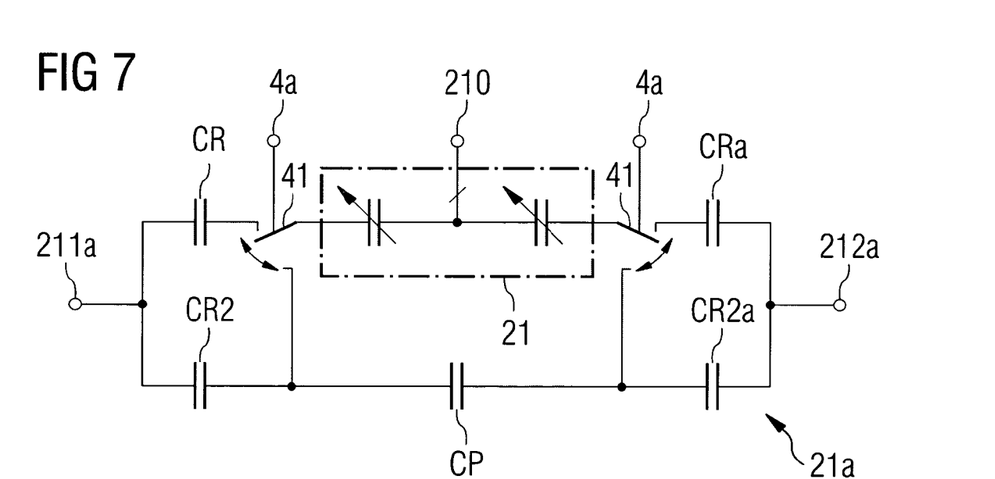
FIG. 7 is a schematic diagram illustrating a second exemplary embodiment of a switchable capacitive element according to the invention.

FIG. 7 shows a second embodiment of a switchable capacitive element 21a. Using switch 41, not only parallel capacitor CP is connected or disconnected in parallel but also it is switched between two different series capacitors CR, CRa and CR2, CR2a. So in different modes different coupling capacitors can be selected. Accordingly, a further way for determining the frequency step size is given.

In a further embodiment of the invention, a control voltage for controlling a value of capacitance for the plurality of switchable capacitor devices of the first capacitive element is adjustable depending on the selected mode.

In a capacitive element with switchable capacitor devices, normally all capacitor devices are controlled with the same control voltage for adjusting the capacitance. So a fixed difference of capacitance between off and on states of the capacitor device is determined. If different control voltages for the on and/or off state of the capacitor device are chosen for different modes, the change of capacitance can be influenced and the frequency step size can be varied by selecting a mode.

Figure 8:
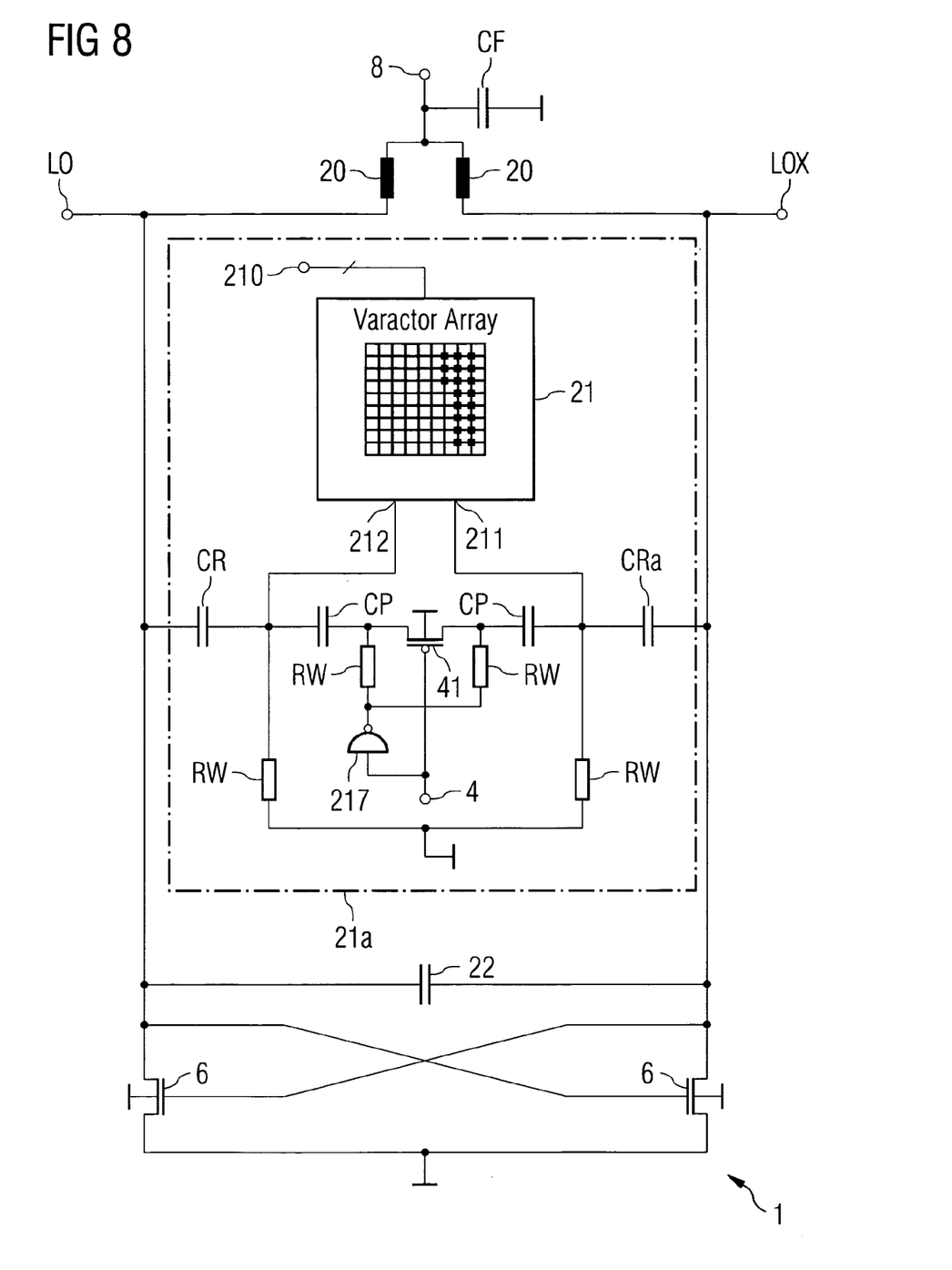
FIG. 8 is a schematic diagram illustrating a second exemplary embodiment of the oscillator device according to the invention.

FIG. 8 shows a second embodiment of an oscillator device 1 according to the invention. The oscillator device 1 comprises inductive elements 20, an arrangement 21a with a first capacitive element 21, a second capacitive element 22, and a deattenuation amplifier 6 which is given by two cross-coupled field effect transistors. An oscillating signal can be taken from an oscillator output LO, LOX. A current is provided to the oscillator device 1 via current input 8. For example, the current is provided by a current source 7, not shown here.

The arrangement 21a further comprises resistors RW which are used to set the DC operating point for the varactors, and a transistor 41 used as a switch for connecting or disconnecting of the parallel capacitors CP. Using an inverter 217, also a defined DC operating point for the transistor 41 shall be set. Unwanted high-frequency elements of the current which is provided on the current input 8 can be filtered by the capacitor CF. The first capacitive element 21 is provided as a digitally controlled varactor array, for example.

Figure 9:
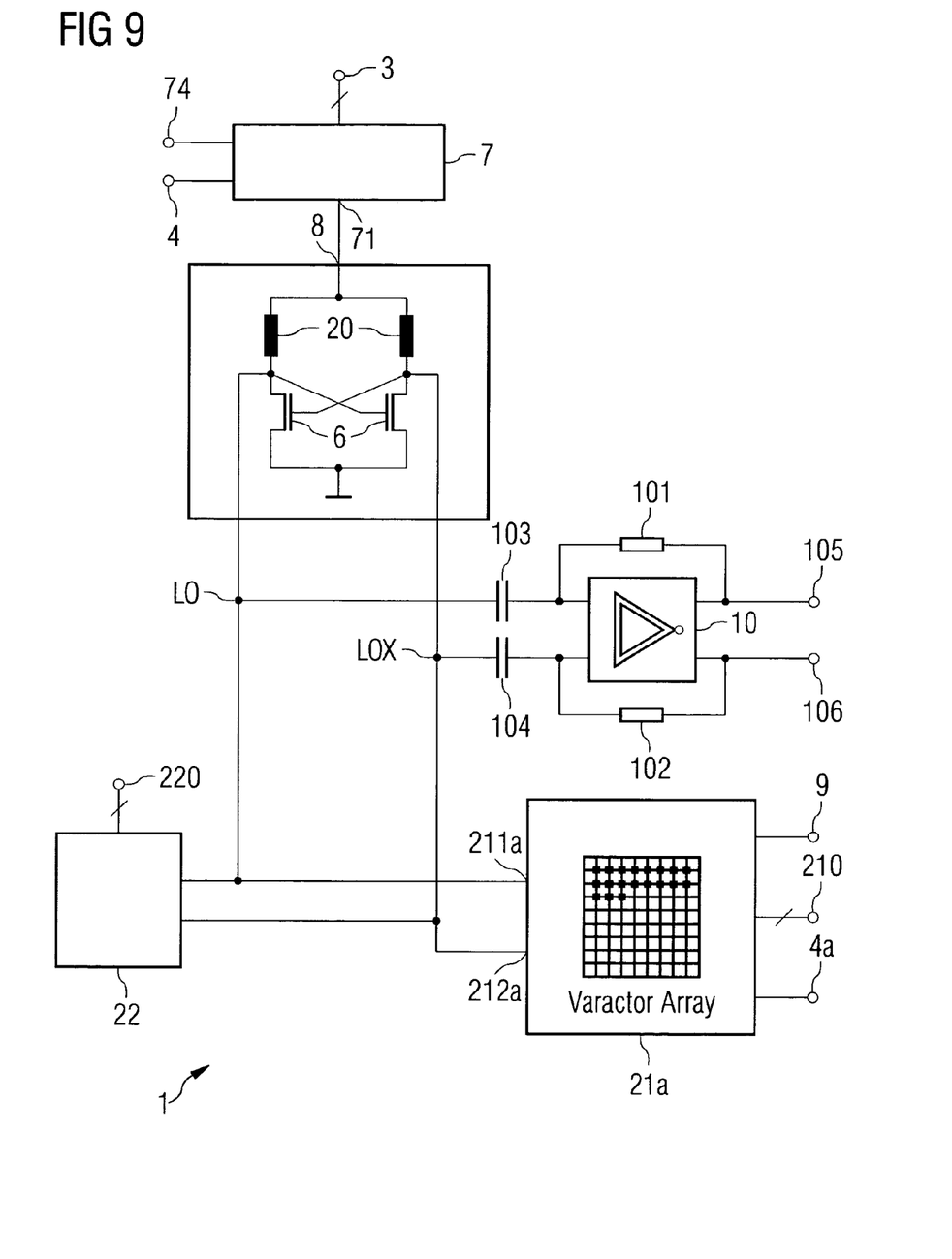
FIG. 9 is a schematic diagram illustrating a third exemplary embodiment of the oscillator device according to the invention.

FIG. 9 shows a third embodiment of the oscillator device 1 according to the invention. It comprises a controllable current source 7 having a programming input 3, a supply voltage connector 74, a selection input 4 and a current output 71 which is connected to the current input 8 of the oscillator core. Arrangement 21a and the second capacitive element 22 are provided as effective capacitances. The oscillating signal on oscillator output LO, LOX is provided to a buffer amplifier 10, AC coupled by coupling capacitors 103 and 104. A DC operating point on the input side of the buffer amplifier 10 is controlled by the feedback resistors 101 and 102. The amplified oscillating signal is provided at the outputs 105 and 106.

A second data word for programming the oscillating frequency with coarse frequency steps can be provided to the second capacitive element 22 on the programming input 220 which is coupled to the programming input 3, not shown here. For example, the second capacitive element 22 is implemented with a plurality of binary weighted varactors.

The arrangement 21a features an input 210 for programming the oscillating frequency with the final predetermined frequency step size. The predetermined frequency step size can, for example, be varied by connecting or disconnecting of parallel capacitors depending on a mode selection signal on a selection input 4a which is coupled to the selection input 4. This was described, for example, in conjunction with FIGS. 6 and 7.

On an input 9, a control voltage can be provided to the arrangement 21a and the controllable capacitor devices comprised therein. If a single capacitor device is switched on, it is provided with this control voltage. So the capacitance of the capacitor device is changed from a first value of capacitance to a second value, as described for FIG. 4. Depending on a mode selection signal, this control voltage can be varied. For example, in a first mode a control voltage of 1.5 V is provided, while in a second mode a control voltage of 0.8 V is used. So the difference of capacitance between switched on or off state of a capacitor device or varactor varies.

With the arrangement shown in FIG. 9, operation is made possible for two different modes of operation, namely for UMTS and GSM/EDGE. UMTS has a coarse tuning bandwidth of 1710 to 1980 MHz and of 824 to 849 MHz. The coarse tuning bandwidth for GSM/EDGE is between 824 to 915 MHz and 1710 to 1910 MHz. The oscillator device is oscillating with a frequency of about 3 to 4 GHz whereby the oscillating signal of the oscillator device is frequency divided by a factor of 2 or 4, respectively, for the respective selected frequency band for UMTS or GSM/EDGE.

In order to realize all frequency bands for dual mode operation, a coarse tuning bandwidth of 3296 to 3960 MHz should be realized. The second capacitive element 22 is controlled by a second data word having for example 10 bits, provided on input 220. For the fine tuning of the frequency, a first data word for example having 10 bit data width is provided on input 210 of the arrangement 21a. The capacitive elements are equipped to have enough overlap so that coarse tuning and fine tuning together can fully cover the whole frequency range.

To fulfill the requirements of phase noise for GSM/EDGE and UMTS, the oscillating amplitude of the oscillator device is adapted accordingly. This is done by controlling the current source 7. The mirroring ratio of the current mirror in the current source 7 is programmed by a data word on programming input 3. The data width of the data word is for example 6 bits, where these 6 bits correspond to the 6 most significant bits of the 10 bit second data word for the coarse frequency tuning. Controlling the current for the oscillator core is done in each mode of operation. The value of the current to be mirrored is determined by the controllable current source 70, shown in FIG. 5, depending on the selected mode, however.

In the arrangement 21a, P-MOS varactor pairs as shown in FIG. 3 are used as capacitor devices for the fine tuning of the oscillating frequency. Due to the well isolation properties in the N-well process, P-MOS devices have flatter on and off state regions in depletion mode and inversion mode. Also the ratio of on state capacitance to off state capacitance is higher compared to N-MOS devices. However, the invention does not preclude N-MOS varactor devices.

In order to achieve the required fine tuning step sizes and a large UMTS modulation bandwidth, also for drifting temperatures and process variations, a first data word with a 10 bit resolution is used for programming the arrangement 21a with the first capacitive element 21.

The described methods for switching between modes for GSM/EDGE and UMTS can be used alternatively or cumulatively in order to fulfill the requirements on different frequency step sizes and different phase noise.

Accordingly, the difference of capacitance between switched on and switched off state of a varactor pair and therefore the frequency step size can be varied by changing the oscillating amplitude. This is done by changing of the current provided by current source 7 by switching the controllable current source 17 with a mode selection signal on input 4 of the current source 7.

The frequency step size is also varied by connecting or disconnecting series capacitors CR, CRa in series and a parallel capacitor CP in parallel to the first capacitive element 21. This is done depending on the mode selection signal on input 4a of the arrangement 21a.

The frequency step size is further influenced by providing a different control voltage for each mode on input 9 of arrangement 21a. So a P-MOS varactor pair has a different capacitance in switched-on state for each mode.

In this embodiment, all P-MOS varactors are equally weighted. With the 10 bit of the first data word, the first capacitive element 21 comprises 1024 selectively switchable P-MOS varactor pairs. By switching one varactor pair, the difference of capacitance ΔC results in the first capacitive element 21, for example. As a consequence, with equation (1), a difference of frequency Δf, equals to $$\Delta f = \frac{1}{2\pi\sqrt{LC}} - \frac{1}{2\pi\sqrt{L(C+\Delta C)}} = f_0\left(1 - \frac{1}{\sqrt{1+\Delta C/C}}\right), \quad (9)$$

where L is the inductance and C is the capacitance which are effective in the oscillator core.

An oscillating signal which is generated in the oscillator device and provided on the signal output is compared with a reference frequency signal in a digital phase detector. The phase detector can be built as a simple phase detector, as a simple frequency detector or as a combination of a phase and a frequency detector. The comparison result is provided to a digital loop filter to provide the stability of the control loop. The output signal of the digital loop filter is provided to the programming input of the oscillator device for programming the desired oscillating frequency. By selecting a mode, the frequency step size for programming the oscillating frequency can be determined. So, a possible use of the digitally controlled phase locked loop for different requirements regarding a frequency step size, for example by different wireless radio system standards, can be assured. In one embodiment of the invention, a frequency divider can be coupled between the oscillator output of the oscillator device and the phase detector. So it is possible to adapt the frequency of the fed back oscillating signal to the frequency of the reference frequency signal.

Figure 10:
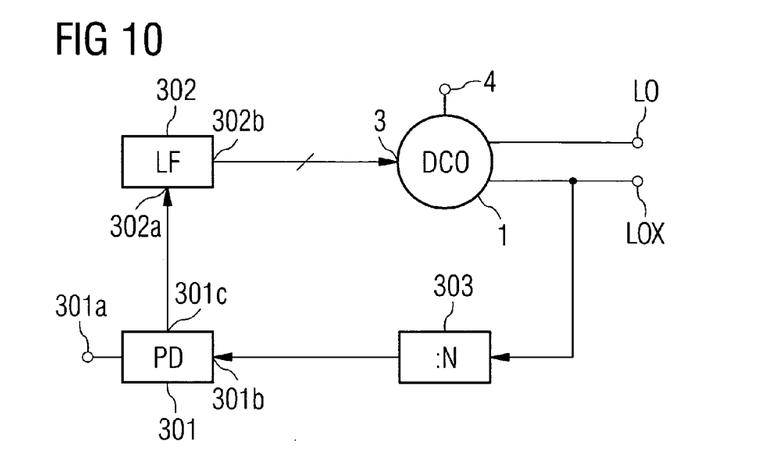
FIG. 10 is a block diagram illustrating a first exemplary embodiment of a digitally controlled phase locked loop according to the invention.

FIG. 10 shows an embodiment of a digitally controlled phase locked loop with an oscillator device 1 according to the invention. The oscillating signal is provided as a differential signal on output LO, LOX of the oscillator device 1. The oscillating signal is provided to an input 301b of a phase detector 301 over a frequency divider 303. A reference frequency signal can be provided on input 301a of the phase detector 301. Its output 301c is connected to an input 302a of a digital loop filter 302. An output 302b of the loop filter 302 is connected to the programming input 3 of the oscillator device 1.

In the digital phase detector 301 the fed back oscillating signal is compared to the reference frequency signal regarding phase and/or frequency. The comparison result is processed by a digital loop filter 302 to a data word which is then provided to the programming input 3 of the oscillator device 1 for programming the oscillating frequency. The data word internally in the oscillator device 1 is split into a first and a second data word. These are provided to the first and the second capacitive element for fine and coarse tuning of the oscillating frequency. Thereby the second data word can be provided as a fixed data word for coarse tuning by the digital loop filter 302. In this case the second data word does not depend on the comparison result of the digital phase detector 301. A part of the data word can, as described for FIG. 9, also be provided to the current source 7. With a mode selection signal on selection input 4, a mode of the oscillator device or the digitally controlled phase locked loop, respectively, can be selected.

As the frequency step size has a nonlinear dependency on the effective capacitance according to equation (9), there may be slightly different frequency step sizes for low and for high oscillating frequencies which are to be programmed. This however is balanced out by the digital loop filter 302.

A Sigma Delta, ΣΔ modulator can be coupled between the digital loop filter and the programming input of the oscillator device. So the oscillating frequency of the oscillating signal provided on the output of the digitally controlled phase locked loop can be adjusted or programmed with a smaller frequency step size than the physically possible frequency step size of the oscillator device. By varying the data word, which is provided to the programming input of the oscillator device, an oscillating frequency can be achieved which is in between two oscillating frequencies achievable by programming. The physically predetermined frequency step size used for programming is not influenced by the output signal of the ΣΔ modulator.

Figure 11:
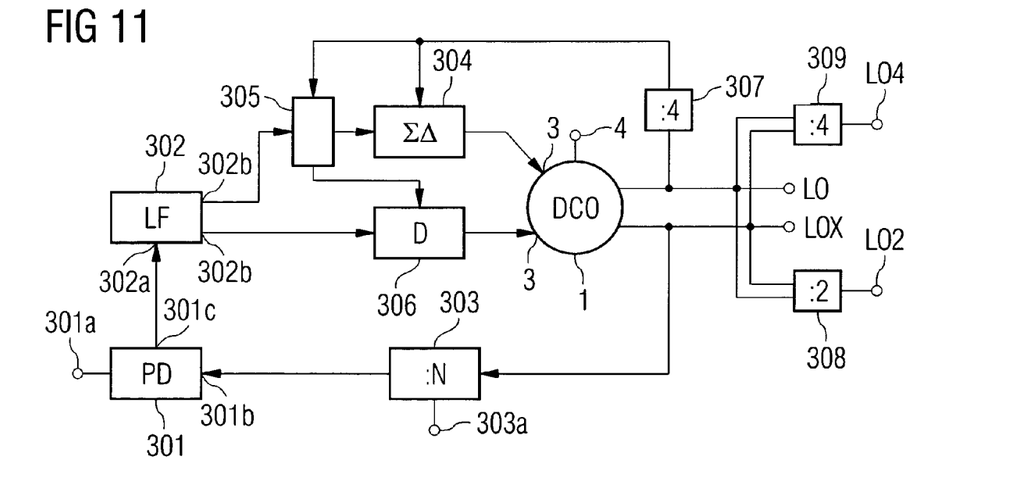
FIG. 11 is a block diagram illustrating a second exemplary embodiment of a digitally controlled phase locked loop according to the invention.

In FIG. 11 a further embodiment of a digitally controlled phase locked loop is shown. Additionally to the elements shown in FIG. 10, the digitally controlled phase locked loop comprises a ΣΔ modulator 304, a synchronizer 305 and a delay element 306. Using a divide by four frequency divider 307, a frequency divided oscillating signal is provided to the ΣΔ modulator 304 and the synchronizer 305. On the outputs LO2 and LO4, oscillating signals frequency divided by the frequency divider 308 and 309 are provided, adapted to the respective required frequency band for GSM or UMTS, respectively.

As a needed effective frequency step size is smaller than the one physically achievable, a method with oversampling and frequency division is used. An integer part of the data word is provided to the oscillator device 1 over a delay element 306. A non-integer, fractional part is processed by the ΣΔ modulator 304. To synchronize the integer and the fractional part in time, the delay time in the delay element 306 is controlled by the synchronizer 305.

Use of the ΣΔ modulator 304, which also acts as a noise shaper, makes it possible to reduce the effective frequency step size depending on the ratio of oversampling frequency to clock frequency of the digital loop filter and the length of the modulator input word which is provided to the ΣΔ modulator 304. The oversampling frequency is the frequency of the signal fed back over the frequency divider 307. A second order ΣΔ modulator with multistage noise shaping, MASH, can be used for the ΣΔ modulator 304. A data word of for example 8 bit is provided as an input signal to the ΣΔ modulator 304.

An oscillating signal on output LO, LOX covers the frequency range from 3296 to 3960 MHz for UMTS and GSM. An oscillating signal is provided on output LO2 after a frequency division by a factor 2 with a frequency in the range of 1710 to 1980 MHz for UMTS and 1710 to 1910 MHz for GSM, respectively. On output LO4 after a frequency division by a factor of 4 an oscillating signal is provided with a frequency in range of 824 to 849 MHz for UMTS and 824 to 915

MHz for GSM, respectively. An adjustment of the oscillating frequency is realized by controlling the frequency divider 303 on an input 303a.

Though in the described embodiments an oscillator core with a cross-coupled deattenuation amplifier 6 is used, actually other oscillator cores can be used instead of cross-coupled ones such as Colpitts oscillators. With the inventive principle, beside the shown LC oscillator core also RC based oscillator cores can be used.

The inventive principle can be transferred to other standards, especially wireless radio system standards like IS95 or other code division multiple access, CDMA based standards.

Regarding the method, by selecting a mode, for example depending on the requirements of a wireless radio system standard, a frequency step size for programming an oscillating frequency is determined. The programming of the oscillating frequency is actually done depending on that frequency step size. So this method can be used for generating radio frequency signals flexibly for different requirements.

In one embodiment of the method, the oscillating frequency additionally is programmed by controlling an oscillating amplitude of the oscillating signal depending on the selected mode.

A first capacitive element can be provided which is frequency determining and programmable. The programming of the oscillating frequency is done by programming a first capacitive element. The oscillating frequency is influenced by the capacitance of the first capacitive element. So by programming a first capacitive element with the data word, the oscillating frequency of the oscillating signal can be controlled or programmed. The capacitance of the first capacitive element can be dependent on the oscillating amplitude of the oscillating signal. So the predetermined frequency step size varies with varied oscillating amplitude depending on a varying capacitance of the first capacitive element.

A parallel capacitor can be connected or disconnected in parallel to the first capacitive element depending on the selected mode. Also it is possible to connect or disconnect a series capacitor in series to the first capacitive element depending on the selected mode.

By connecting or disconnecting series or parallel capacitors, respectively, the influence of a change of capacitance of the first capacitive element on the oscillating frequency changes by a changed frequency step size. So by connecting or disconnecting of the series and/or parallel capacitor, the frequency step size for programming the oscillating signal can be varied.

Alternatively, or in addition, the first capacitive element can be provided with a plurality of switchable varactors. Each of these switchable varactors can be controlled depending on the data word selectively. So the capacitance of the capacitive element is influenced. The varactors are switched between two states characterized by a different capacitance. The capacitance of a varactor depends on the used control voltage for the respective state, for example the difference of capacitances between two states has influence on the frequency step size. By varying the control voltage for one or both states, the difference of capacitance and therefore the frequency step size for programming the oscillating signal is changed.

This control voltage for controlling the capacitance of the plurality of switchable varactors of the first capacitive element can be varied depending on the selected mode.

In a further embodiment of the method, a second capacitive element is provided which is frequency determining and programmable. When programming the oscillating frequency, the programming is also done by programming the second capacitive element. Thereby, the second capacitive element is programmed with a frequency step size which is greater than the predetermined frequency step size.

So by programming the second capacitive element, a coarse tuning of the frequency and by programming the first capacitive element, a fine tuning of the oscillating signal is done.

In another embodiment of the method, the oscillating signal is compared to a reference frequency signal. The comparison result is filtered using a digital loop filter. From the result of the filtering, a data word on which programming the oscillating frequency depends is generated. So an exact programming of the oscillating frequency of the oscillating signal is achieved.

The oscillating signal can be frequency divided before comparing it with the reference frequency signal. So the oscillating frequency of the oscillating signal can be adapted to the frequency of the reference frequency signal.

The data word which is used for programming the oscillating frequency can be generated at least partially using $\Sigma\Delta$ modulation. So a fine frequency tuning is achieved. The selecting of a mode can be done depending on a mobile communication standard or wireless radio system standard, especially GSM/EDGE or UMTS.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims.

In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A digitally controlled oscillator device, comprising:
   a programming input configured to receive a first multibit data word for programming an oscillating frequency of the oscillator device, wherein the programming occurs in discrete amounts dictated by a same predetermined frequency step size for each incremental adjustment in the first multibit data word;
   an oscillator core comprising a first programmable capacitive element configured to influence a frequency of the oscillator device, the first capacitive element coupled to the programming input for receiving the first multi bit data word;
   a deattenuation amplifier coupled to the oscillator core;
   a selection input configured to receive a mode selection signal; and
   a selection unit coupled between the selection input and a mode input of the oscillator core, wherein the selection unit is configured to select a mode from a plurality of modes depending on the mode selection signal, and wherein each mode of the plurality of modes dictates a size of the predetermined frequency step size of the oscillator core.

2. The oscillator device of claim 1, wherein the oscillator core comprises a second capacitive element configured to influence a frequency of the oscillator device.

3. The oscillator device of claim 2, wherein the second capacitive element is programmable and coupled to the programming input that is configured to receive a second data word, and wherein the second capacitive element is configured to influence the oscillating frequency of the oscillator device based on the second data word.

4. The oscillator device of claim 3, wherein the first capacitive element is configured to provide a fine tuning of the oscillating frequency with the predetermined frequency step size; and
   wherein the second capacitive element is configured to provide a coarse tuning of the oscillating frequency with a frequency step size that is greater than the predetermined frequency step size.

5. The oscillator device of claim 2, wherein the first or the second capacitive element, or both, comprises a plurality of switchable capacitor devices.

6. The oscillator device of claim 5, wherein the plurality of switchable capacitor devices of the second capacitive element comprise a binary weighting with respect to one another.

7. The oscillator device of claim 5, wherein the plurality of switchable capacitor devices of the first or second capacitive element, or both, comprises a plurality of switchable varactors.

8. The oscillator device of claim 5, further comprising a control voltage coupled to the plurality of switchable capacitor devices, the control voltage configured to control a value of capacitance for the plurality of switchable capacitor devices of the first capacitive element depending on the selected mode dictated by the mode selection signal.

9. The oscillator device of claim 1, further comprising a current source coupled to the selection unit, wherein the current source is configured to control a value of a current depending on the selected mode dictated by the mode selection signal, and further configured to adjust an oscillating amplitude of the oscillator device, wherein the current is provided to the oscillator core.

10. The oscillator device of claim 1, further comprising a voltage controller coupled to the selection unit, wherein the voltage controller is configured to control a value of a voltage depending on the selected mode dictated by the mode selection signal, and further configured to adjust an oscillating amplitude of the oscillator device, wherein the voltage is provided to the oscillator core.

11. The oscillator device of claim 1, further comprising a parallel capacitor selectively connected in parallel to the first capacitive element depending on the selected mode dictated by the mode selection signal.

12. The oscillator device of claim 1, further comprising a series capacitor selectively connected in series to the first capacitive element depending on the selected mode dictated by the mode selection signal.

13. A digitally controlled phase locked loop, comprising:
   an oscillator device comprising:
      a programming input configured to receive a first multibit data word for programming an oscillating frequency of the oscillator device, wherein the programming occurs in discrete amounts dictated by a same predetermined frequency step size for each incremental adjustment in the first multibit data word;
      an oscillator core comprising a first programmable capacitive element configured to influence a frequency of the oscillator device, the first capacitive element coupled to the programming input for receiving the first multi bit data word;
      a deattenuation amplifier coupled to the oscillator core;
      a selection input configured to receive a mode selection signal; and
      a selection unit coupled between the selection input and a mode input of the oscillator core, wherein the selection unit is configured to select a mode from a plurality of modes depending on the mode selection signal, and wherein each mode of the plurality of modes dictates a size of the predetermined frequency step size of the oscillator core;
      wherein the oscillator device comprises an oscillator output configured to provide an oscillating signal with the oscillating frequency;
   a phase locked loop signal output coupled to the oscillator device output;
   a digital phase detector comprising a first input configured to receive a reference frequency signal, a second input coupled to the phase locked loop signal output, and an output; and
   a digital loop filter comprising an input coupled to the output of the phase detector, and an output coupled to the programming input of the oscillator device.

14. The digitally controlled phase locked loop of claim 13, further comprising a frequency divider coupled between the oscillator device output and the second input of the digital phase detector.

15. The digitally controlled phase locked loop claim 13, further comprising a sigma-delta-modulator coupled between the loop filter output and the programming input of the oscillator device.

16. A method for generating an oscillating signal with an oscillator device, comprising:
   selecting a mode from a plurality of modes, wherein each mode dictates a size of a frequency step size for programming an oscillating frequency of the oscillating signal;
   ascertaining the frequency step size based on the selected mode;
   programming the oscillating frequency in discrete steps based on a data word and the selected mode with the discrete steps based on the predetermined frequency step size; and
   programming the oscillating frequency by controlling an oscillating amplitude of the oscillating signal based on the selected mode.

17. The method of claim 16, further comprising providing a first programmable capacitive element configured to influence the oscillating frequency, wherein the oscillating frequency is programmed by programming the first capacitive element.

18. The method of claim 17, further comprising selectively connecting a parallel capacitor in parallel to the first capacitive element based on the selected mode.

19. The method of claim 17, further comprising selectively connecting a series capacitor in series to the first capacitive element based on the selected mode.

20. The method of claim 17, wherein the first capacitive element comprises a plurality of switchable varactors.

21. The method of claim 20, further comprising adjusting a control voltage to control a value of capacitance associated with the plurality of switchable varactors of the first capacitive element based on the selected mode.

22. The method of claim 17, further comprising providing a second programmable capacitive element configured to influence the oscillating frequency, wherein the oscillating frequency is programmed by programming the second capacitive element, and wherein the second capacitive element is programmed with a frequency step size that is greater than the predetermined frequency step size.

23. The method of claim 16, further comprising:
comparing the oscillating signal with a reference frequency signal, thereby obtaining a comparison result;
filtering the comparison result using a digital loop filter; and
generating the data word for programming the oscillating frequency based on the filtered comparison result.

24. The method of claim 23, further comprising frequency dividing the oscillating signal before comparing it with the reference frequency signal.

25. The method of claim 23, wherein the data word is generated at least partially using sigma-delta-modulation.

26. The method of claim 16, wherein the mode is selected based on a mobile communication standard.

27. A digitally controlled oscillator device, comprising:
means for receiving a multibit data word;
means for generating an oscillating signal with an oscillating frequency, wherein the oscillating frequency is programmable with a frequency based on the multibit data word and variable in discrete amounts dictated by a predetermined frequency step size;
means for selecting a mode from a plurality of modes, wherein each mode of the plurality of modes dictates an amount of the predetermined frequency step size; and
means for deattenuating the oscillating signal.

28. The oscillator device of claim 27, wherein the generating means comprises a capacitive element having a capacitance that is dependent on the data word and is variable in discrete amounts dictated by the predetermined frequency step size.

29. The oscillator device of claim 28, wherein the selecting means is controlled by an oscillating amplitude of the oscillating signal based on the selected mode.

30. The oscillator device of claim 28, wherein the selecting means is operable to selectively connect a capacitor in parallel to the capacitive element based on the selected mode.

31. The oscillator device of claim 28, wherein the selecting means is operable to selectively connect a capacitor in series to the capacitive element based on the selected mode.

32. A method for generating an oscillating signal with an oscillator device, comprising:
selecting a mode from a plurality of modes, wherein each mode dictates a size of a frequency step size for programming an oscillating frequency of the oscillating signal;
ascertaining the frequency step size based on the selected mode;
programming the oscillating frequency in discrete steps based on a data word and the selected mode with the discrete steps based on the predetermined frequency step size;
providing a first programmable capacitive element configured to influence the oscillating frequency, wherein the oscillating frequency is programmed by programming the first capacitive element; and
adjusting the frequency step size by selectively connecting a parallel capacitor in parallel to the first capacitive element or connecting a series capacitor in series to the first capacitive element based on the selected mode.

* * * * *